US008644009B2

(12) United States Patent
Rylski et al.

(10) Patent No.: US 8,644,009 B2
(45) Date of Patent: Feb. 4, 2014

(54) THERMOSTAT WITH INTERCHANGEABLE INSERT

(75) Inventors: Erik O. Rylski, St. Louis, MO (US); William D. Rhodes, Redbud, IL (US)

(73) Assignee: Emerson Electric Co., St. Louis, MO (US)

( * ) Notice: Subject to any disclaimer, the term of this patent is extended or adjusted under 35 U.S.C. 154(b) by 146 days.

(21) Appl. No.: 13/006,041

(22) Filed: Jan. 13, 2011

(65) Prior Publication Data

US 2011/0110023 A1      May 12, 2011

(51) Int. Cl.
*H05K 5/03*      (2006.01)
(52) U.S. Cl.
USPC ............. 361/679.01; 361/679.27; 361/679.55
(58) Field of Classification Search
USPC ..................................... 361/679.01
See application file for complete search history.

(56) References Cited

U.S. PATENT DOCUMENTS

| | | | |
|---|---|---|---|
| 3,151,759 | A | 10/1964 | Dykzeul et al. |
| 7,227,083 | B2 | 6/2007 | Ciemny et al. |
| 7,586,040 | B1 | 9/2009 | Bala et al. |
| 2005/0083168 | A1 * | 4/2005 | Breitenbach .................. 337/380 |
| 2006/0086062 | A1 * | 4/2006 | Ashworth ........................ 53/397 |
| 2007/0140314 | A1 * | 6/2007 | Rhodes et al. ................. 374/158 |
| 2007/0161421 | A1 * | 7/2007 | Latto et al. .................. 455/575.8 |

OTHER PUBLICATIONS

Venstar ColorTouch Thermostat; http://www.venstarthermostats.com/Touch-Screen-Thermostat/c39/p134/Venstar-T5800-ColorTouch/product_info.html; Oct. 6, 2010.

* cited by examiner

*Primary Examiner* — Tuan T Dinh
*Assistant Examiner* — Mukund G Patel
(74) *Attorney, Agent, or Firm* — Harness, Dickey & Pierce, P.L.C.

(57) ABSTRACT

A thermostat includes a housing having a generally rectangular frame-shaped surface that extends around a display device, and first and second side walls on opposing sides of the housing. The first and second side walls of the housing each include at least one recessed notch therein. The various thermostat embodiments further include a colored insert having a generally rectangular frame-shaped configuration, which matches the generally rectangular frame-shaped surface of the housing. The colored insert is disposed over the housing so as to substantially cover the generally rectangular frame-shaped surface of the housing. The various thermostat embodiments further include a single translucent faceplate having an aperture therein, a generally rectangular frame-shaped surface extending around the aperture, and first and second side walls on opposing sides of the single translucent faceplate that include at least one engaging clip configured to engage the recessed notches in the housing.

19 Claims, 3 Drawing Sheets

THERMOSTAT WITH INTERCHANGEABLE INSERT

FIELD

The present disclosure relates to thermostats for controlling a heating or air-conditioning unit for a space, and more specifically to the appearance of such thermostats.

BACKGROUND

This section provides background information related to the present disclosure which is not necessarily prior art.

Conventional HVAC systems for adjusting the temperature within a space typically include a thermostat with a visual display and a housing that is typically mounted on a wall of the space. Such thermostats have housings that are similar in color and are usually white in nature, which may or may not necessarily match the design theme of the inhabited space. It is therefore desirable to have an improved thermostat in which the visual appearance of the housing is aesthetically pleasing and more in harmony with the interior design theme for the space.

SUMMARY

This section provides a general summary of the disclosure and various embodiments, and is not a comprehensive disclosure of its full scope or all of its features.

Various embodiments of a thermostat are provided that include an interchangeable insert for selectively and conveniently changing the visual appearance of the thermostat. The various thermostat embodiments include a display device and a housing in which the display device is disposed. The housing has a generally rectangular frame-shaped surface that extends around the display device, and first and second side walls on opposing sides of the housing. The first and second side walls of the housing each include at least one recessed notch therein. The various thermostat embodiments further include an interchangeable insert having a generally rectangular frame-shaped configuration, which matches the generally rectangular frame-shaped surface of the housing. The interchangeable insert is disposed over the housing so as to substantially cover the generally rectangular frame-shaped surface of the housing. The various thermostat embodiments further include a single translucent faceplate having an aperture therein, a generally rectangular frame-shaped surface extending around the aperture, and first and second side walls on opposing sides of the single translucent faceplate that include at least one engaging clip configured to engage the recessed notches in the housing, such that the interchangeable insert is visible through the single translucent faceplate. The interchangeable insert preferably has an outer portion that has a colored or a textured surface that, when disposed beneath the translucent faceplate, provides for selectively and conveniently changing the appearance of the thermostat.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

In the various embodiments of the present disclosure, a thermostat for a space within a premise is provided that includes an interchangeable insert for selectively and conveniently changing the visual appearance of the thermostat to match the theme of the space. In one aspect of the present disclosure, the various thermostat embodiments include a display device and a housing in which the display device is disposed. The housing has a generally rectangular frame-shaped surface that extends around the display device, and first and second side walls on opposing sides of the housing. The first and second side walls of the housing each include at least one recessed notch therein. The various thermostat embodiments further include an interchangeable insert having a generally rectangular frame-shaped configuration, which matches the generally rectangular frame-shaped surface of the housing. The interchangeable insert is disposed over the housing so as to substantially cover the generally rectangular frame-shaped surface of the housing. The various thermostat embodiments further include a single translucent faceplate having an aperture therein, a generally rectangular frame-shaped surface extending around the aperture, and first and second side walls on opposing sides of the single translucent faceplate that include at least one engaging clip configured to engage the recessed notches in the housing.

Figure 1:
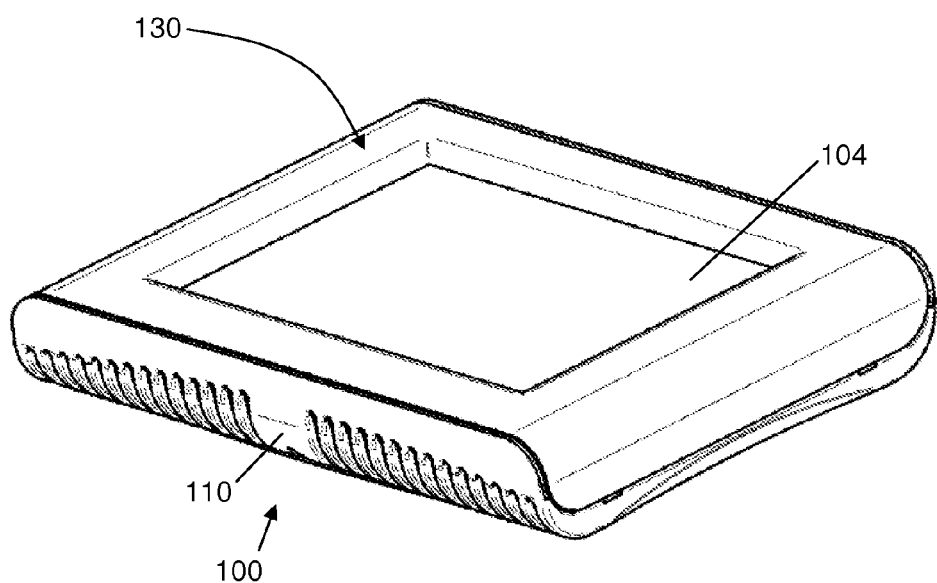
FIG. 1 is a perspective view of one embodiment of a thermostat configured for selectively and conveniently changing the visual appearance of the thermostat, according to the principles of the present disclosure.

In one embodiment of the present disclosure, a thermostat configured for selectively and conveniently changing the visual appearance of the thermostat housing is shown generally at 100 in FIG. 1. The thermostat 100 includes a display device 104 having a generally rectangular shape, and a housing 110 in which the display device 104 is disposed. The thermostat 100 further includes a translucent faceplate 130 that is configured to be secured over an insert (not shown) and to the housing 110 such that the insert is between the translucent faceplate 130 and the housing 110 and is visible through the translucent faceplate 130, as will be described below.

Figure 2:
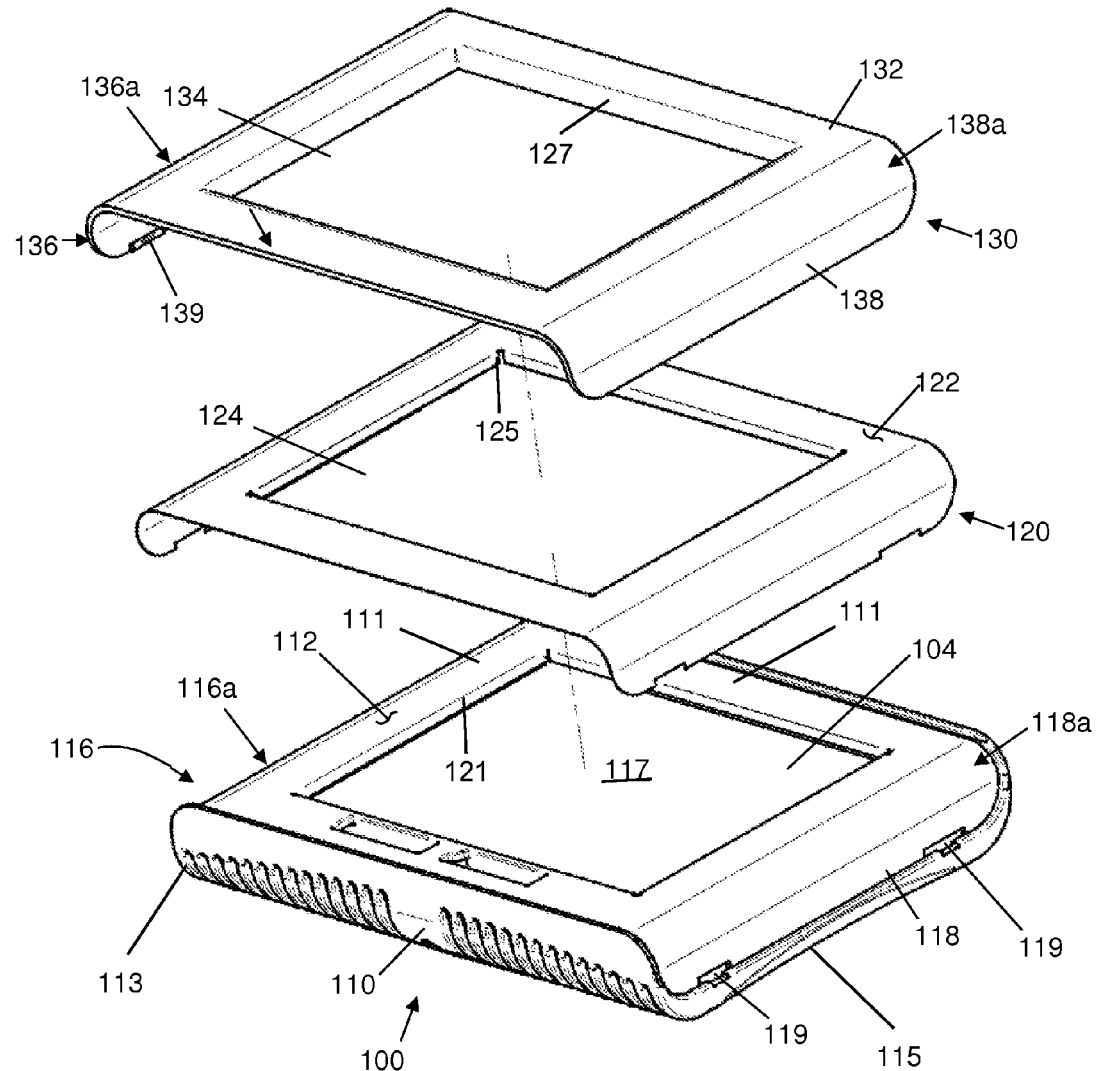
FIG. 2 is an exploded view of the thermostat in FIG. 1, showing a colored insert and faceplate of the thermostat, according to the principles of the present disclosure.

Referring to FIG. 2, the housing 110 includes a top portion 111 and a bottom portion 113. The bottom portion 113 includes a pair of oppositely oriented edge portions 115. The top portion 111 of the housing 110 has a generally rectangular frame-shaped surface 112 that extends around and surrounds the display device 104 so as to define an aperture 117 through which the display device 104 is visible, and a first side wall 116 and second side wall 118 on opposing sides of the housing 110. In the present example embodiment, the aperture 117 is defined by beveled edges 121 of the housing top portion 111. The first side wall 116 of the housing 110 includes a curved portion 116a, which adjoins and transitions into the generally rectangular frame-shaped surface 112 of the housing 110. The second side wall 118 of the housing 110 includes a curved portion 118a, which adjoins and transitions into the generally rectangular frame-shaped surface 112 of the housing 110. The curved portions 116a, 118a adjoin the generally rectangular frame-shaped surface 112 such that that the first side wall 116 and second side wall 118 transition smoothly into the end portions of the generally rectangular frame-shaped surface 112. The housing 110 further including at least one recessed notch 119 in each of the first and second side wails 116, and 118. Each of the first and second side walls 116, 118 of the housing 110 depicted in FIG. 2 preferably include at least two recessed notches 119.

As shown in FIG. 2, the thermostat 100 further includes at least one interchangeable insert 120 having a generally rectangular frame-shaped configuration that matches the generally rectangular frame-shaped surface 112 of the housing 110. The interchangeable insert 120 has an aperture 124 therein that substantially aligns with the display device 104, such that the interchangeable insert 120 may be disposed over the housing 110 so as to substantially cover the generally rectangular frame-shaped surface 112 of the housing 110 extending around the display device 104. The at least one interchangeable insert 120 is preferably interchangeable, and has an outer surface 122 that comprises a colored surface or a textured surface that, when disposed beneath the translucent faceplate 130, provides for selectively and conveniently changing the visual appearance of the thermostat to correspond to the textures or décor of the space in which the thermostat is mounted. For example, the interchangeable insert 120 may have a surface that is textured or includes a particular pattern, which is visible through the translucent faceplate 130 and corresponds with a particular pattern on a wall on which the thermostat 100 is mounted. Similarly, the interchangeable insert 120 may have a particular color that is visible through the translucent faceplate 130 and corresponds with a particular color of a wall on which the thermostat 100 is mounted.

The at least one interchangeable insert 120 preferably is one of a plurality of colored inserts, at least one of which is positioned over the housing 110 so as to substantially cover the generally rectangular frame-shaped surface 112 to change the appearance of the thermostat 100. The interchangeable insert 120 is configured to be interchangeable with other colored inserts, such that a user may select an interchangeable insert 120 or a particular color (or texture or pattern) that changes the appearance of the thermostat 100 to more closely match a color theme in the interior of the space. The interchangeable insert 120 is preferably one of a plurality of colored inserts of different colors, which a user selects and positions over the housing 110 so as to substantially cover the generally rectangular frame-shaped surface 112 of the housing 110.

Figure 3:
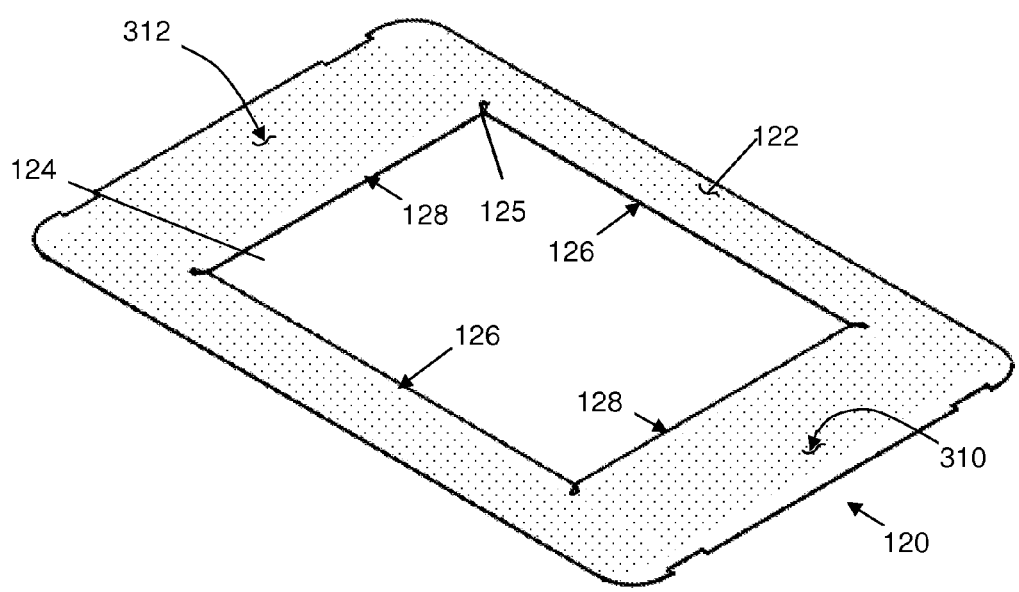
FIG. 3 is a perspective view of one embodiment of a colored insert for a thermostat, in accordance with the present disclosure.

It should be noted that the interchangeable insert 120 may cover only the front of the rectangular frame-shaped surface 112 of the housing 110, or may further extend to cover the first and second side walls 116, 118 of the housing 110, as shown in FIG. 2. In this configuration, the interchangeable insert 120 is generally flat as shown in FIG. 3, and may further include notches 125 defining flaps 126 and 128 that are pushed into shape around the display device 104. The interchangeable insert 120 in FIG. 3 (shown with a textured pattern instead of a color on its surface) also has outer members 310 and 312 that may be pushed into shape against the side walls 116, 118 of the housing 110 and around the display device 104 when the interchangeable insert 120 is retained by a translucent face plate 130 described below.

Referring back to FIG. 2, the thermostat 100 further includes a single translucent faceplate 130 having an aperture 134 therein, a generally rectangular frame-shaped surface 132 extending around the aperture 134 and in which beveled edges 127 are defined, and first and second side walls 136, 138 on opposing sides of the single translucent faceplate 130. The single translucent faceplate 130 includes at least one engaging clip 139 on each of the first and second side wails 136, 138. The engaging clips 139 on the first and second side walls 136, 138 are configured to engage the recessed notches 119 in the housing 110, to secure the single translucent faceplate 130 over the interchangeable insert 120 and to the housing 110 such that the interchangeable insert 120 is visible through the single translucent faceplate 130. It should be noted that the interchangeable insert 120 has an aperture 124 therein that substantially aligns with the aperture 134 in the single translucent faceplate 130 when the single translucent faceplate 130 is secured to the housing 110. Preferably, each of the first and second side walls 136, 138 of the single translucent faceplate 130 include at least two engaging clips 139 that are configured to engage the at least two recessed notches 119 in the housing 110. As shown in FIG. 2, the single translucent faceplate 130 does not extend over the top portion or bottom portion of the housing 110, but rather only extends over the side walls 116, 118 of the housing 110. The first side wall 136 and the second side wall 138 of the single translucent faceplate 130 include a curved portions 136a and 138a respectively, which adjoin and transition into the generally rectangular frame-shaped surface 132 of the single translucent faceplate 130. In addition, the single translucent faceplate 130 is preferably configured to have a spacing between the generally parallel end portions of the first and second sidewalls 136, 138 on the translucent faceplate 130 that is narrower than the distance between the first and second side walls 116, 118 on opposing sides of the housing 110. This spacing between the first and second side walls 136, 138 enables the single translucent faceplate 130 to be secured to the thermostat 100 by the tension established in the edge portions of the first and second side walls 136, 138 when the single translucent faceplate 130 is secured to the housing 110.

Accordingly, the thermostat 100 shown in FIG. 2 includes only a single translucent faceplate 130, which is not interchangeable with another single translucent faceplate 130 so as to change the appearance of the thermostat. Instead, the thermostat 100 includes a plurality of interchangeable inserts 120, at least one of which is positioned over the housing 110 so as to substantially cover the generally rectangular frame-shaped surface 112 of the housing 110 and change the appearance of the thermostat 100. Since the interchangeable insert 120 is configured to be interchangeable with an interchangeable insert 120 that is colored or textured, the user may select (from a plurality of interchangeable inserts) one that is colored or textured and changes the appearance of the thermostat 100 to more closely match the theme for the space.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, and/or components, but do not preclude the presence or addition of one or more other features, elements, components, and/or groups thereof.

When an element or surface is referred to as being "on," "engaged to," "connected to," or "coupled to" another element or surface, it may be directly on, engaged, connected or coupled to the other element or surface, or intervening elements or surfaces may be present. Other words used to describe the relationship between elements should be interpreted in a like fashion (e.g., "between" versus "directly between," "adjoining" versus "directly adjacent," etc.). As used herein, the term "and/or" includes any and all combinations of one or more of the associated listed items.

Although the terms first, second, third, etc. may be used herein to describe various elements, components, regions, surfaces and/or sections, these elements, components, regions, surfaces and/or sections should not be limited by these terms. Spatially relative terms may be intended to encompass different orientations of the device in use or operation in addition to the orientation depicted in the figures. The device may be otherwise oriented (rotated 90 degrees or at other orientations) and the spatially relative descriptors used herein interpreted accordingly.

What is claimed is:

1. A thermostat comprising:
   a display device;
   a housing in which the display device is disposed, the housing having a bottom portion and a top portion, the top portion having a generally rectangular frame-shaped surface that extends around the display device, and first and second opposed side walls extending from the frame-shaped surface into juxtaposition with first and second edge portions of the bottom portion, the housing further including at least one recessed notch in each of the first and second side walls;
   at least one interchangeable insert having a generally rectangular frame that corresponds to the top portion of the housing, the interchangeable insert being selectively disposable over the housing so as to substantially cover the generally rectangular frame-shaped surface and first and second opposed side walls of the housing, the insert having a textured, colored, or patterned surface; and
   a single translucent faceplate having an aperture therein, a generally rectangular frame-shaped surface extending around the aperture, and first and second side walls on opposing sides of the single translucent faceplate, the single translucent faceplate including at least one engaging clip on each of the first and second side walls for engaging the recessed notches in the housing to secure the single translucent faceplate over the interchangeable insert and to the housing such that the interchangeable insert is visible through the single translucent faceplate and prevented, by engagement of the clips and notches, from separating from the thermostat, the insert being bent to acquire non-planar contours of the housing frame-shaped surface and of the housing first and second side walls.

2. The thermostat of claim 1, wherein the first and second edge portions of the housing bottom portion have a thin profile relative to the housing top portion side wall juxtaposed thereon.

3. The thermostat of claim 1, wherein the first and second edge portions of the housing bottom portion appear generally flush with a surface when the thermostat is mounted thereto.

4. The thermostat of claim 3, wherein the spacing between end portions of the first and second sidewalls of the single translucent faceplate is narrower than the distance between the first and second side walls on opposing sides of the housing, such that the single translucent faceplate is secured to the thermostat by the tension established in the faceplate end portions when the single translucent faceplate is secured to the housing.

5. The thermostat of claim 4, wherein the first and second side walls of the housing include a curved portion that adjoins the generally rectangular frame-shaped surface of the housing such that the first and second side walls transition smoothly into the generally rectangular frame-shaped surface.

6. The thermostat of claim 5, wherein the insert includes:
   an edge defining an aperture corresponding generally to the aperture of the faceplate and to an aperture of the housing top portion; and
   a plurality of notches in the edge defining a plurality of flaps conformable to beveled edges of the housing top portion aperture and/or faceplate aperture.

7. The thermostat of claim 1, wherein the insert is conformed behind the faceplate to acquire curves and creases.

8. The thermostat of claim 1, wherein the insert is configurable between the housing and faceplate such that opposed ends of the insert extend toward a surface to which the thermostat is mounted.

9. The thermostat of claim 1, wherein the interchangeable insert is one of a plurality of inserts of different textured surfaces that is visible through the single translucent faceplate, at least one of which is positioned over the housing so as to substantially cover the generally rectangular frame-shaped surface of the housing with the textured surface of the interchangeable insert being visible through the single translucent faceplate, to thereby change the appearance of the thermostat.

10. A thermostat comprising:
    a display device;
    a housing in which the display device is disposed, the housing having top and bottom portions, the top portion having a generally rectangular frame-shaped surface that extends around the display device, and first and second side walls on opposing sides of the housing, wherein the first and second side walls include a curved portion that adjoins the generally rectangular frame-shaped surface such that the first and second side walls transition smoothly from the generally rectangular frame-shaped surface into juxtaposition with first and second edge portions of the bottom portion, where one of the first and second edge portions of the bottom portion exhibits a thin profile relative to the top portion side wall juxtaposed thereon, the housing further including at least one recessed notch in each of the first and second side walls;
    at least one insert having a generally rectangular frame that generally matches the generally rectangular frame-shaped surface of the housing, the insert being selectively disposable over the housing so as to substantially cover the top portion of the housing, the insert having a textured, colored, or patterned surface; and a single translucent faceplate having an aperture therein, a generally rectangular frame-shaped surface extending around the aperture, and first and second side walls on opposing sides of the single translucent faceplate, the single translucent faceplate including at least one engaging clip on each of the first and second side walls for engaging the recessed notches in the housing to secure the single translucent faceplate over the insert and to the housing such that the insert acquires a curvature matching the curved portion of the housing top portion first and second side walls, is visible through the single translucent faceplate and prevented, by engagement of the clips and notches, from separating from the thermostat.

11. The thermostat of claim 10 wherein the insert has an aperture therein that substantially aligns with the aperture in the single translucent faceplate when the single translucent faceplate is secured to the housing.

12. The thermostat of claim 10, wherein the at least one insert comprises a plurality of colored inserts, at least one of which is positioned so as to substantially cover the generally rectangular frame-shaped surface of the housing and change the appearance of the thermostat.

13. The thermostat of claim 12, wherein the insert is interchangeable with another insert, such that the user may select an insert that changes the appearance of the thermostat.

14. The thermostat of claim 10, wherein the insert includes:
an edge defining an aperture corresponding generally to the aperture of the faceplate and to an aperture of the housing top portion; and
a plurality of notches in the edge defining a plurality of flaps conformable to beveled edges of the housing top portion aperture and/or faceplate aperture.

15. The thermostat of claim 14, wherein the notches provide smooth joints in corners where the flaps are conformed to the beveled edges.

16. The thermostat of claim 15, wherein the faceplate and housing frame-shaped surface comprise beveled edges defining the apertures of the faceplate and housing, and the insert comprises a plurality of notches allowing edges defining the aperture of the insert to be conformed to the beveled edges.

17. The thermostat of claim 10, wherein the spacing between end portions of the first and second sidewalls of the single translucent faceplate is narrower than the distance between the first and second side walls on opposing sides of the housing, such that the single translucent faceplate is secured to the thermostat by the tension established in the faceplate end portions when the single translucent faceplate is secured to the housing.

18. The thermostat of claim 10, wherein the insert is generally flat and includes flaps that are pushed into a curved shape around the side walls of the housing and are creased to form a beveled edge around the display device when the insert is retained by the translucent face plate.

19. A thermostat comprising:
a housing in which a display device of the thermostat is disposed, the housing having a bottom portion and a top portion including a generally frame-shaped surface and a pair of opposed side walls each extending between the frame-shaped surface and a corresponding one of a pair of oppositely oriented edge portions of the housing bottom portion;
an interchangeable insert selectively disposable over and conformable to the frame-shaped surface and housing side walls so as to assume curves and creases that match curves and creases of the housing frame-shaped surface and side walls and to provide an aperture that matches the aperture of the housing, the insert having a textured, colored, or patterned surface; and
a translucent faceplate having an aperture generally matching the aperture of the housing frame-shaped surface, the faceplate including at least one engaging clip on each of two opposed side walls of the faceplate, for engaging recessed notches in the oppositely oriented edge portions of the housing bottom portion to secure the faceplate over the insert and to the housing such that the insert is visible through the faceplate and prevented from separating from the thermostat;
opposed edges of the insert being coextensive with the opposed side walls of the housing and faceplate and generally flush with the opposed edge portions of the housing bottom portion.

\* \* \* \* \*